United States Patent
Hsu et al.

(10) Patent No.: US 12,247,831 B2
(45) Date of Patent: *Mar. 11, 2025

(54) METHOD OF INSPECTING FLATNESS OF SUBSTRATE

(71) Applicant: Darwin Precisions Corporation, Hsinchu County (TW)

(72) Inventors: Chin-Wang Hsu, Hsinchu County (TW); Wen-Yi Lin, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/615,126

(22) Filed: Mar. 25, 2024

(65) Prior Publication Data

US 2024/0230323 A1    Jul. 11, 2024

Related U.S. Application Data

(62) Division of application No. 17/689,371, filed on Mar. 8, 2022, now Pat. No. 12,000,693.

(30) Foreign Application Priority Data

Apr. 23, 2021 (TW) .................. 110114723

(51) Int. Cl.
G01B 11/30     (2006.01)
G01B 11/00     (2006.01)

(52) U.S. Cl.
CPC ........... *G01B 11/30* (2013.01); *G01B 11/002* (2013.01)

(58) Field of Classification Search
CPC ..... G01B 11/002; G01B 11/30; G01B 11/306; H01L 21/67253; H01L 21/67288; Y02P 90/30
USPC ...................................... 356/237.2
See application file for complete search history.

(56) References Cited

U.S. PATENT DOCUMENTS

| | | | |
|---|---|---|---|
| 8,459,073 B2 | 6/2013 | Isei et al. | |
| 11,367,629 B2* | 6/2022 | Tanaka | H01L 21/67046 |
| 2009/0147248 A1 | 6/2009 | Kohayase | |
| 2014/0073002 A1 | 3/2014 | Yamauchi | |
| 2015/0066425 A1 | 3/2015 | Chang et al. | |

(Continued)

FOREIGN PATENT DOCUMENTS

CN      105509661 A     4/2016

*Primary Examiner* — Sunghee Y Gray
(74) *Attorney, Agent, or Firm* — WPAT, PC

(57) ABSTRACT

A method of inspecting flatness of substrate is provided and includes providing a substrate. N first inspecting points are selected from the surface of the substrate along a first straight line, where the coordinate of the i-th first inspecting point is $(X_i, Y_i, Z_i)$. By using a formula $$"D = \sum_{i=1}^{N-1} \sqrt{(X_{i+1} - X_i)^2 + (Y_{i+1} - Y_i)^2 + (Z_{i+1} - Z_i)^2},"$$

a first measurement length D is calculated. By using a formula "F=(D−S)/S", a first flatness index F is calculated. S is the horizontal distance between 1st first inspecting point and N-th first inspecting point. When the first flatness index F is larger than a first threshold, the substrate is determined to be unqualified.

10 Claims, 4 Drawing Sheets

(56) References Cited

U.S. PATENT DOCUMENTS

2017/0141315 A1    5/2017  Ikenaga
2017/0241916 A1    8/2017  Leconte
2019/0371638 A1*  12/2019  Wu ................... H01L 21/67383

* cited by examiner

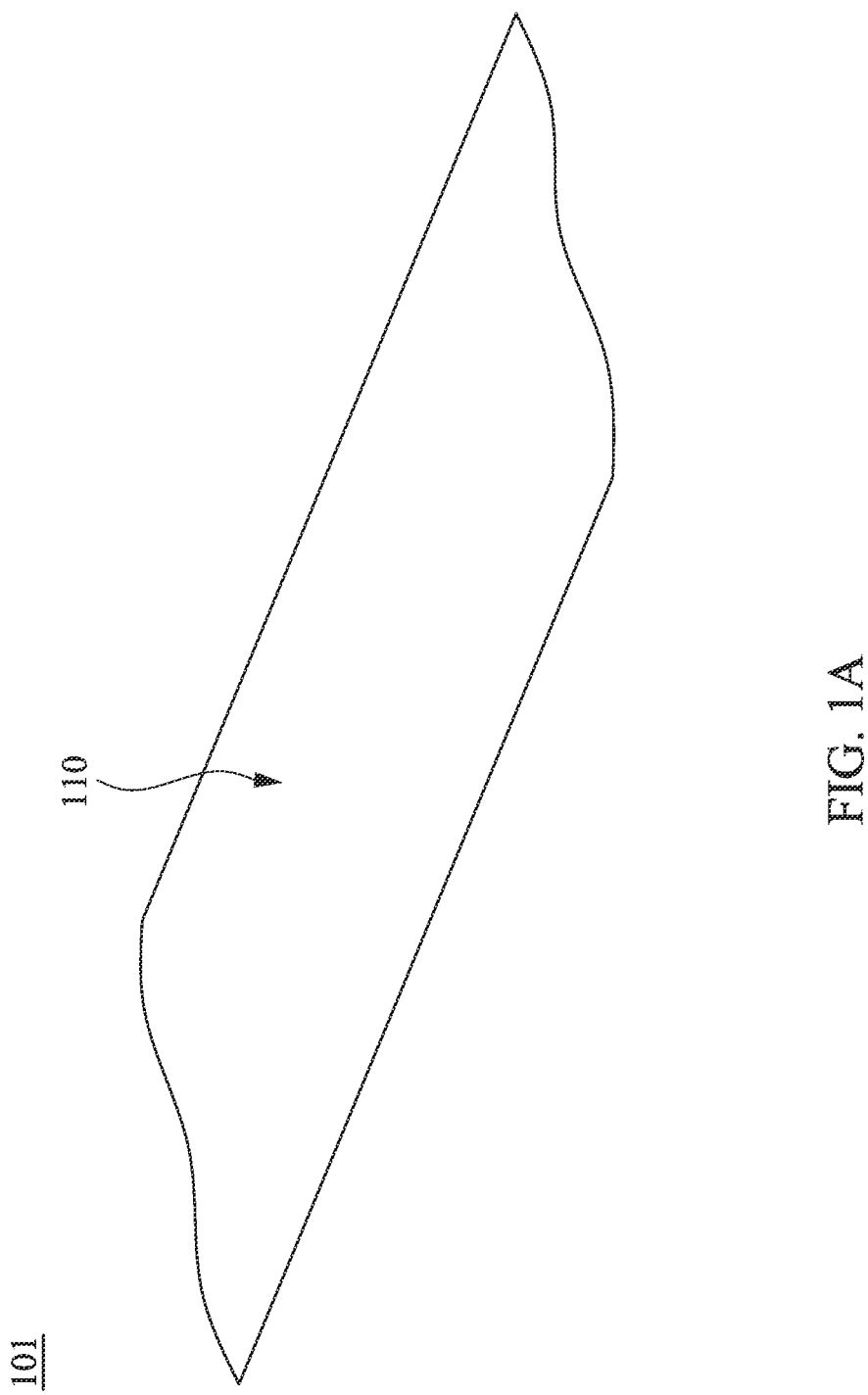

METHOD OF INSPECTING FLATNESS OF SUBSTRATE

CROSS-REFERENCE TO RELATED APPLICATION

The present application is a Divisional Application of the U.S. application Ser. No. 17/689,371, filed Mar. 8, 2022, which claims priority to Taiwan Application Serial Number 110114723, filed Apr. 23, 2021, all of which are herein incorporated by reference in their entireties.

BACKGROUND

Technical Field

The present disclosure relates to an inspecting method. More particularly, the present disclosure relates to a method of inspecting the flatness of a substrate.

Description of Related Art

Some of current display panels are made by using a fine metal mask (FMM). Taking an organic light emitting diode (OLED) display panel for example, some of the OLED display panels are made by evaporation at present. In the process of the evaporation, the FMM is disposed on a glass plate at first and close to the glass plate, so that the vapor plumes produced by evaporation can be deposited on the glass plate and where an opening pattern of the FMM exposes.

High resolution is the current trend in display panels, and a metal mask (e.g., FMM) needs a significantly flat surface to manufacture a high-resolution display panel. Otherwise, it is difficult to manufacture a qualified high-resolution display panel, resulting in low yields.

SUMMARY

The disclosure according to at least one embodiment provides a method of inspecting the flatness of a substrate to help to improve the yields of the display panels.

A method of inspecting the flatness of a substrate according to at least one embodiment includes providing the substrate having a surface. N first inspecting points are selected from the surface along a first straight line, in which the coordinate of i-th first inspecting point is $(X_i, Y_i, Z_i)$. Afterwards, a first measurement length D is calculated by using a formula:

$$D = \sum_{i=1}^{N-1} \sqrt{(X_{i+1} - X_i)^2 + (Y_{i+1} - Y_i)^2 + (Z_{i+1} - Z_i)^2}.$$

A first flatness index F is calculated by using a formula: $F=(D-S)/S$, in which S is a horizontal distance between $1^{st}$ first inspecting point and N-th first inspecting point. When the first flatness index F is larger than a first threshold, the substrate is determined to be unqualified.

A method of inspecting the flatness of a substrate according to another embodiment includes providing the substrate having a surface. A plurality of first inspecting points are selected from the surface along a plurality of side-by-side first straight lines, in which N first inspecting points are selected along each of the first straight lines, and the coordinate of i-th first inspecting point is $(X_i, Y_i, Z_i)$. A first measurement length D corresponding to each of the first straight lines is calculated by using a formula:

$$D = \sum_{i=1}^{N-1} \sqrt{(X_{i+1} - X_i)^2 + (Y_{i+1} - Y_i)^2 + (Z_{i+1} - Z_i)^2}.$$

A plurality of first flatness indexes F are calculated, in which a first flatness index F corresponding to each of the first straight lines is calculated by using a formula: $F=(D-S)/S$, and S is a horizontal distance between $1^{st}$ first inspecting point and N-th first inspecting point along one of the first straight lines. Afterwards, a first average of the first flatness indexes F corresponding to the first straight lines is calculated. When the first average is larger than a first threshold, the substrate is determined to be unqualified.

Based on the above, by using the above method of inspecting, a substrate with good flatness can be picked up for manufacturing a metal mask, so as to help to improve the yields of the display panels.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIGS. 1A and 1B are schematic views of a method of inspecting flatness according to at least one embodiment of the disclosure.

DETAILED DESCRIPTION

Figure 1B:
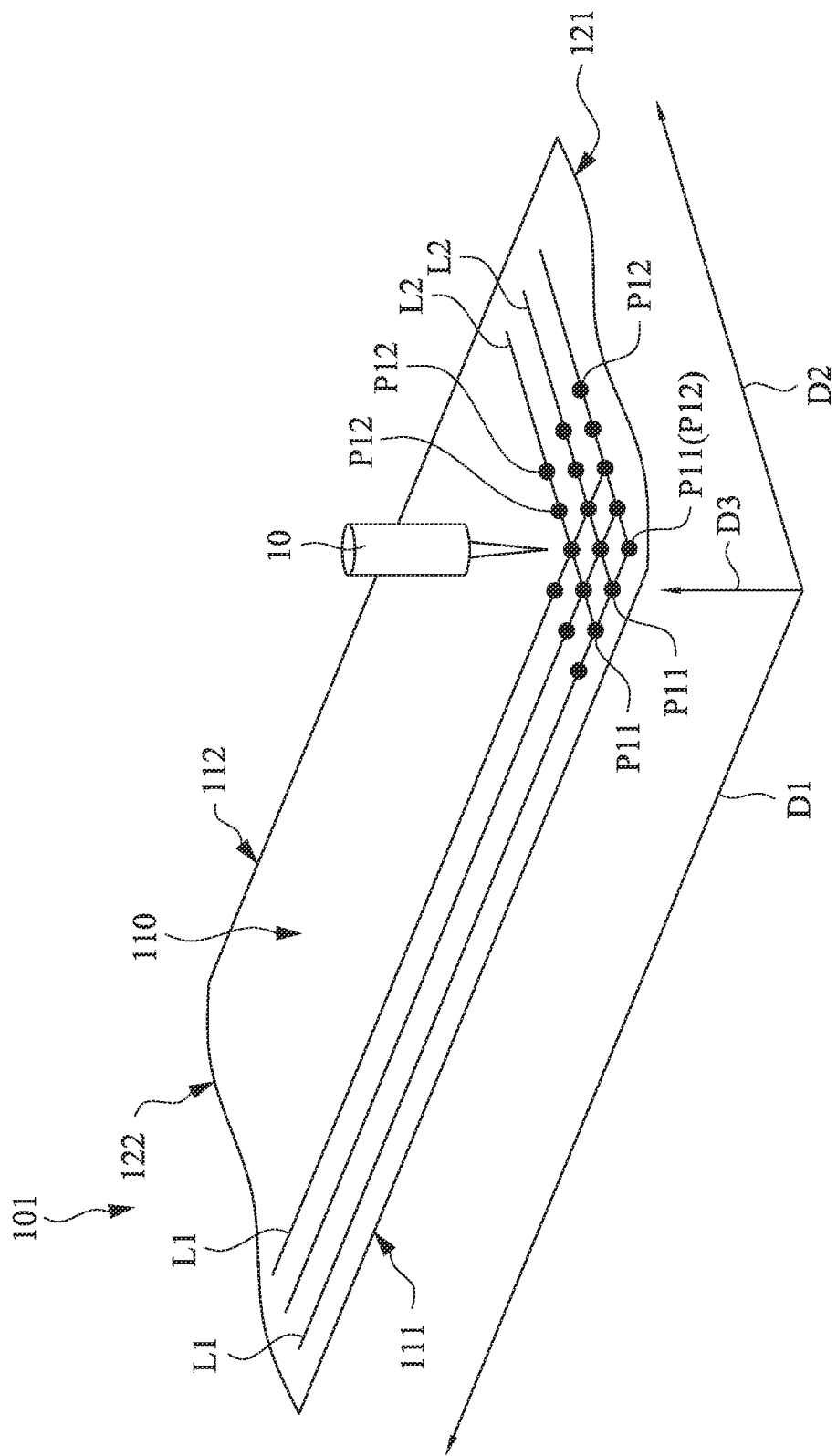

In the following description, in order to clearly present the technical features of the present disclosure, the dimensions (such as length, width, thickness, and depth) of elements (such as layers, films, substrates, and areas) in the drawings will be enlarged in unusual proportions. Accordingly, the description and explanation of the following embodiments are not limited to the sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the disclosure. The permissible deviation range can be caused by the error generated during the measurement, where the error is caused by such as the limitation of the measurement system or the process conditions. In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties.

FIGS. 1A and 1B are schematic views of a method of inspecting flatness according to at least one embodiment of the disclosure. Referring to FIG. 1A, in the method of inspecting, first, a substrate 101 having a surface 110 is provided. The substrate 101 can be a metal sheet and made by calendering a metal material, in which the metal material can be stainless steel or nickel-iron alloy, and the nickel-iron alloy can be invar, which has a significantly low coefficient of thermal expansion.

At the macroscopic scale, the surface 110 is roughly a flat surface. In other words, when common people watch or touch the substrate 101 without using any precision instrument for measurement, most common people will regard the surface 110 as a flat surface. However, at the microscopic scale, the surface 110 is not so flat. For example, when the surface 110 is measured by using an optical dimension measuring device, it can be found that the surface 110 has an undulation. When the undulation of the surface 110 has a height difference below a certain degree, the substrate 101 can be performed in the sequential process, so as to manufacture a metal mask. Conversely, when the undulation of the surface 110 has a height difference over the certain degree, the substrate 101 will need reworking, such as annealing, even scrapping.

Referring to FIG. 1B, then, a plurality of first inspecting points P11 are selected from the surface 110 along a plurality of side-by-side first straight lines L1, in which N first inspecting points can be selected along each of the first straight lines, and N is a natural number greater than 1. Thus, each of the first straight lines L1 corresponds to at least two first inspecting points P11. The first inspecting points P11 can be selected by an optical dimension measuring device 10. Even if the first inspecting points P11 are not marked on the surface 110, the optical dimension measuring device 10 can select the first inspecting points P11 from the surface 110 directly. Hence, all of the first inspecting points P11 can be virtual point, and the first straight lines L1 also can be virtual. Accordingly, the first inspecting points P11 and the first straight lines L1 can be invisible in fact.

In addition, in the embodiment, a plurality of second inspecting points P12 can be selected from the surface 110 along a plurality of side-by-side second straight lines L2. The optical dimension measuring device 10 can select the second inspecting points P12 from the surface 110 directly, so the second straight lines L2 and the second inspecting points P12 also can be virtual. That is, the second inspecting points P12 and the second straight line L2 can be invisible in fact.

M second inspecting points P12 are selected along each of the second straight lines L2, in which M is a natural number greater than 1, so each of the second straight lines L2 can correspond to at least two second inspecting points P12. In addition, in the embodiment, the length of each of the first straight lines L1 can be longer than the length of each of the second straight lines L2, so that N can be larger than M. In other words, the quantity of the first inspecting points P11 corresponding to each of the first straight lines L1 can be larger than the quantity of the second inspecting points P12 corresponding to each of the second straight lines L2.

The second straight lines L2 are not parallel to the first straight lines L1. Taking FIG. 1B for example, all of the first straight lines L1 extend in a first direction D1, whereas all of the second straight lines L2 extend in a second direction D2, in which the first direction D1 is different from the second direction D2. For example, the first direction D1 can be substantially perpendicular to the second direction D2. Hence, the second straight lines L2 are not parallel to the first straight lines L1. Taking FIG. 1B for example, the second straight line L2 can be substantially perpendicular to the first straight line L1.

It is worth mentioning that since the second straight line L2 can be substantially perpendicular to the first straight line L1, the first straight lines L1 and the second straight lines L2 can cross to be arranged in a mesh, as shown in FIG. 1B. Hence, the first straight lines L1 and the second straight lines L2 crossing to each other can form at least one pair of the first inspecting point P11 and the second inspecting point P12 overlapping, i.e., at least one first inspecting point P11 and at least one second inspecting point P12 overlap.

Taking FIG. 1B for example, FIG. 1B illustrates three first straight lines L1 and three second straight lines L2 crossing to each other, in which the first straight lines L1 and the three second straight lines L2 intersect at nine points, while nine first inspecting points P11 and nine second inspecting points P12 are located at the nine points respectively. Hence, the nine first inspecting points P11 and the nine second inspecting points P12 overlap respectively. In other words, in the intersections of the first straight lines L1 and the second straight lines L2, the first inspecting points P11 are substantially equivalent to the second inspecting points P12, that is, the inspecting points (i.e., the first inspecting points P11 and the second inspecting point P12) where the first straight lines L1 and the second straight lines L2 overlap can be shared with each other.

Figure 2A:
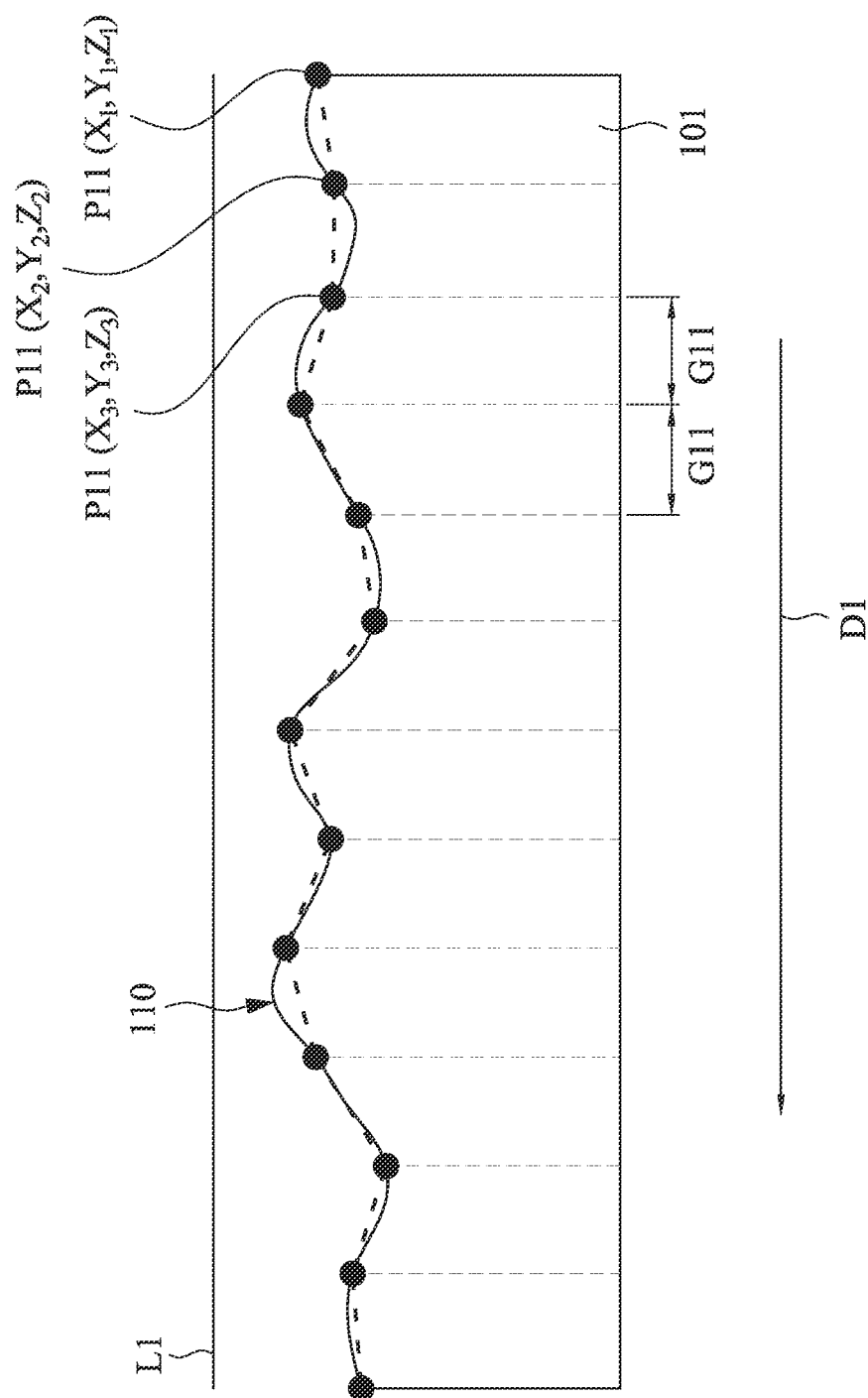
FIG. 2A is a schematic cross-sectional view along one of the first straight lines in FIG. 1B.

FIG. 2A is a schematic cross-sectional view along one of the first straight lines in FIG. 1B, in which the substrate 101 has a pair of long sides 111 and 112, and the substrate 101 shown in FIG. 2A is drawn with a cross-section along the first straight line L1 closest to the long side 111 when viewed in the second direction D2, for example.

Referring to FIGS. 1B and 2A, a horizontal distance G11 exists between any adjacent two of the first inspecting points P11, where the horizontal distance G11 can be a distance between adjacent two first inspecting points P11 in the first direction D1, as shown in FIG. 2A. In other words, a horizontal distance G11 is equal to a distance between two positions where adjacent two first inspecting points P11 are vertically projected on the same first straight line L1. In addition, there is a substantially constant horizontal distance G11 between adjacent two of the first inspecting points P11 selected along the same first straight line L1, so that a plurality of positions where the first inspecting points P11 are vertically projected on the same first straight line L1 can be arranged at a substantially equal distance.

The first inspecting points P11 have its coordinate apiece, and the coordinates of the first inspecting points P11 are different from each other, in which the coordinates of the first inspecting points P11 can be given by the optical dimension measuring device 10. In the embodiment shown in FIG. 2A, $1^{st}$ first inspecting point P11 in the far right has a coordinate $(X_1, Y_1, Z_1)$, and $2^{nd}$ first inspecting point P11 adjacent to $1^{st}$ first inspecting point P11 has a coordinate $(X_2, Y_2, Z_2)$. $3^{rd}$ first inspecting point P11 adjacent to and to the left of $2^{nd}$ first inspecting point P11 has a coordinate $(X_3, Y_3, Z_3)$, and N-th first inspecting point P11 in the far left has a coordinate $(X_N, Y_N, Z_N)$, and so on and so forth.

Therefore, i-th first inspecting point P11 has a coordinate $(X_i,Y_i,Z_i)$, where i is a natural number greater than Zero and less than or equal to N.

Next, by using the following formula (1), a first measurement length corresponding to each of the first straight lines L1 is calculated, in which D shown in the formula (1) is the first measurement length, and $X_i, X_{i+1}, Y_i, Y_{i+1}, Z_i$ and $Z_{i+1}$ are the coordinate-values of the first inspecting points P11 selected along the same first straight line L1, such as coordinate $(X_1,Y_1,Z_1)$ of $1^{st}$ first inspecting point P11 and coordinate $(X_i,Y_i,Z_i)$ of i-th first inspecting point P11. The quantity of the first straight lines L1 can be equal to the quantity of the first measurement lengths D that are calculated, i.e., the first straight lines L1 can correspond to the first measurement lengths D one by one.

$$D = \sum_{i=1}^{N-1} \sqrt{(X_{i+1} - X_i)^2 + (Y_{i+1} - Y_i)^2 + (Z_{i+1} - Z_i)^2} \quad \text{formula (1)}$$

In the embodiment, the horizontal distance G11 can be less than or equal to 1 cm. Since the surface 110 has the undulation, the surface 110 shown in FIG. 2A is drawn as a wavy curved line, which has a plurality of crests and throughs. In the embodiment, the horizontal distance between adjacent crest and trough is expected to be not more than 1 cm, so that the horizontal distance G11 less than or equal to 1 cm can cause that a line formed by connecting the first inspecting points P11 shown in FIG. 2A can be close to the real surface 110, so as to reduce the error value of calculating the first measurement length D.

Afterwards, a first flatness index corresponding to each of the first straight lines L1 can be calculated by using the following formula (2).

$$F = (D - S)/S \quad \text{formula (2)}$$

In the formula (2), F is the first flatness index, D is the first measurement length, and S is the horizontal distance between $1^{st}$ first inspecting point P11 and N-th first inspecting point P11 selected along the same first straight line L1, where the horizontal distance (S) can be equivalent to the length of single first straight line L1, so that the horizontal distance (S) can be near, equivalent to, or equal to the length of the long sides 111, i.e., the length of the substrate 101.

It can be known from the formula (2) that one first flatness index F can be calculated from one first measurement length D, and the quantity of the first straight lines L1 can be equal to the quantity of the first measurement lengths D that are calculated, so that a plurality of first flatness indexes F can be calculated according to formula (2) under the condition that the quantity of the first straight lines L1 is multiple. Afterwards, a first average of the first flatness indexes F is calculated, in which the first average is an arithmetic mean, for example.

When the first average is larger than a first threshold, the substrate 101 is determined to be unqualified. For example, the first threshold can be 2, and if the first average calculated according to the first inspecting points P11 is larger than 2, it means that the flatness of the surface 110 of the substrate 101 is bad, so that this substrate 101 is not suitable for manufacturing high-resolution display panel. Hence, the substrate 101 with the first average larger than 2 need reworking, such as annealing, even scrapping.

It is worth mentioning that in the embodiment, the first direction D1 and the second direction D2 can be parallel to two of the coordinate axes of the coordinates of the first inspecting points P11, and a third direction D3 perpendicular to both the first direction D1 and the second direction D2 can be parallel to the other coordinate axis of the coordinates of the first inspecting points P11. Since the first straight line L1 extends in the first direction D1, the first inspecting points P11 shown in FIG. 2A can be located in a plane parallel to two coordinate axes.

For example, in FIG. 1B, the first direction D1 can be regarded as X axis of the coordinate, the second direction D2 can be regarded as Y axis of the coordinate, and the third direction D3 can be regarded as Z axis of the coordinate. Accordingly, the plane where the first inspecting points P11 shown in FIG. 2A are located is parallel to the first direction D1 (X axis) and the third direction D3 (Z axis), but is perpendicular to the second direction D2 (Y axis), so that the coordinates of the first inspecting points P11 shown in FIG. 2A have the same Y values, such as $Y_1$, $Y_2$, $Y_i$ and $Y_{i+1}$, and $Y_1=Y_2=Y_i=Y_{i+1}$. Hence, when calculating the first measurement length D, the formula (1) can be simplified into the following formula (3).

$$D = \sum_{i=1}^{N-1} \sqrt{(X_{i+1} - X_i)^2 + (Z_{i+1} - Z_i)^2} \quad \text{formula (3)}$$

Figure 2B:
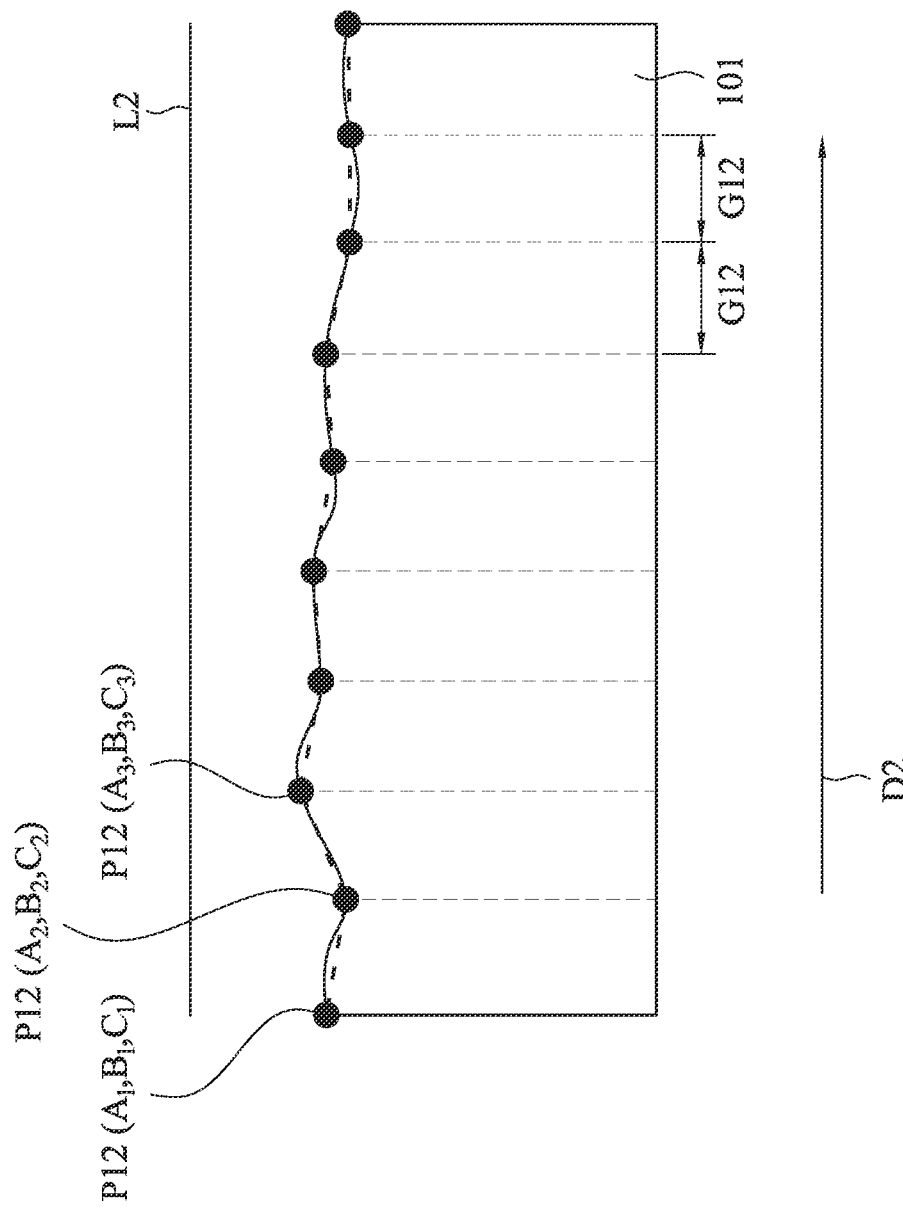
FIG. 2B is a schematic cross-sectional view along one of the second straight lines in FIG. 1B.

FIG. 2B is a schematic cross-sectional view along one of the second straight lines in FIG. 1B, where the substrate 101 further has a pair of short sides 121 and 122, and the substrate 101 shown in FIG. 2B is drawn with a cross-section along the second straight line L2 closest to the short side 121 when viewed in the first direction D1, for example.

Referring to FIGS. 1B and 2B, a horizontal distance G12 exists between any adjacent two of the second inspecting points P12, where the horizontal distance G12 can be a distance between adjacent two second inspecting points P12 in the second direction D2. Thus, a horizontal distance G12 is equal to a distance between two positions where adjacent two second inspecting points P12 are vertically projected on the same second straight line L2, as shown in FIG. 2B.

There is a substantially constant horizontal distance G12 between adjacent two of the second inspecting points P12 selected along the same second straight line L2, so that a plurality of positions where the second inspecting points P12 are vertically projected on the same second straight line L2 can be arranged at a substantially equal distance, in which the horizontal distance G12 can be less than or equal to 1 cm, and the horizontal distances G11 and G12 can be equal.

Similar to the first inspecting points P11, the second inspecting points P12 have coordinates different from each other, and the coordinates of the second inspecting points P12 can be given by the optical dimension measuring device 10. In the embodiment shown in FIG. 2B, $1st$ second inspecting point P12 in the far left has a coordinate $(A_1,B_1,C_1)$, and $2^{nd}$ second inspecting point P12 adjacent to $1^{st}$ second inspecting point P12 has a coordinate $(A_2,B_2,C_2)$. Likewise, $3^{rd}$ second inspecting point P12 adjacent to and to the right of $2^{nd}$ second inspecting point P12 has a coordinate $(A_3,B_3,C_3)$, and M—the second inspecting point P12 in the right far has a coordinate $(A_M,B_M,C_M)$. Therefore, j-th second inspecting point P12 has a coordinate $(A_j,B_j,C_j)$, where j is a natural number greater than Zero and less than or equal to M.

Next, the second measurement length corresponding to each of the second straight lines L2 is calculated by using the following formula (4), where d shown in the formula (4) is the second measurement length, and $A_j, A_{j+1}, B_j, B_{j+1}, C_j$ and $C_{j+1}$ are the coordinate-values of the second inspecting points P12 selected along the same second straight line L2. The quantity of the second straight lines L2 can be equal to the quantity of the second measurement lengths d that are calculated. In other words, the second straight lines L2 can correspond to the second measurement lengths one by one.

$$d = \sum_{j=1}^{M-1} \sqrt{(A_{j+1} - A_j)^2 + (B_{j+1} - B_j)^2 + (C_{j+1} - C_j)^2} \quad \text{formula (4)}$$

It is worth mentioning that the coordinate-values of both the second inspecting points P12 and the first inspecting points P11 can belong to the same coordinate system. For example, $A_i$ and $X_i$ can be the same values of the X axis, $B_i$ and $Y_i$ can be the same values of the Y axis, and $C_i$ and $Z_i$ can be the same values of the Z axis. In addition, in the embodiment shown in FIG. 1B, since some first inspecting points P11 are substantially equivalent to the second inspecting points P12, the coordinate-values of at least one first inspecting point P11 are equal to the coordinate-values of at least second inspecting point P12.

Similar to first inspecting points P11 shown in FIG. 2A, the second inspecting points P12 shown in FIG. 2B can be located in a plane parallel to two coordinate axes of the second inspecting points P12. For example, the plane where the second inspecting points P12 shown in FIG. 2B are located is parallel to the second direction D2 (Y axis) and the third direction D3 (Z axis), but perpendicular to the first direction D1 (X axis), so that the coordinates of the second inspecting points P12 shown in FIG. 2B have the same A values (i.e., X axis), for example, $A_1=A_i=A_{i+1}$. Hence, when calculating the second measurement length d, the formula (4) can be simplified into the following formula (5).

$$d = \sum_{j=1}^{M-1} \sqrt{(B_{j+1} - B_j)^2 + (C_{j+1} - C_j)^2} \quad \text{formula (5)}$$

Afterwards, the second flatness index corresponding to each of the second straight lines L2 can be calculated by using the following formula (6).

$$f = (d - R)/R \quad \text{formula (6)}$$

In the formula (6), f is the second flatness index, d is the second measurement length, and R is a horizontal distance between $1^{st}$ second inspecting point P12 and M-th second inspecting point P12 selected along the same second straight line L2, in which R can be equivalent to the length of single second straight line L2. Hence, R can be near, equivalent to, or equal to the length of the short sides 121, i.e., the width of the substrate 101.

According to the formula (6), one second flatness index f can be calculated from one second measurement length d, and the quantity of the second straight lines L2 can be equal to the quantity of the second measurement lengths d that are calculated. Hence, a plurality of second flatness index f can be calculated according to formula (6) under the condition that the quantity of the second straight lines L2 is multiple. Afterwards, a second average of the second flatness indexes f of the second straight lines L2 is calculated, in which the second average is an arithmetic mean, for example.

When the second average is larger than a second threshold, it means that the flatness of the surface 110 of the substrate 101 is bad, so that the substrate 101 is determined to be unqualified, and the substrate 101 is not suitable for manufacturing high-resolution display panel. Hence, the unqualified substrate 101 is not suitable for manufacturing high-resolution display panel and needs reworking, such as annealing, even scrapping. Moreover, the second threshold also can be 2.

When the first average is less than or equal to the first threshold (e.g., 2), and the second average is less than or equal to the second threshold (e.g., 2), it means that the surface 110 of the substrate 101 has good flatness and is suitable for manufacturing high-resolution display panel, so that the substrate 101 is determined to be qualified, and the qualified substrate 101 can be performed in the sequential process, such as photolithography and etching, thereby forming a metal mask. Therefore, by using the method of inspecting disclosed in the above embodiments, a substrate 101 with good flatness can be picked up for manufacturing a metal mask, so as to help to improve the yields of the display panels, thereby facilitating to manufacture high-resolution display panel.

It is necessary to note that in the above embodiments, a plurality of first inspecting points P11 and a plurality of second inspecting points P12 are selected along a plurality of first straight lines L1 and a plurality of second straight lines L2. However, in other embodiment, the flatness of the substrate 101 can be inspected along only one first straight line L1 or only one second straight line L2, in which only one first flatness index F or only one second flatness index f can be calculated by using the above formulas (1) to (6).

When the first flatness index F is larger than the first threshold (e.g., 2), or the second flatness index f is larger than the second threshold (e.g., 2), the substrate 101 is determined to be unqualified. When the first flatness index F is less than or equal to the first threshold, and the second flatness index f is less than or equal to second threshold, the substrate 101 is determined to be qualified. In other words, under the condition that the quantity of the first straight line L1 or the second straight line L2 is only one, the steps of calculating the first average and the second average can be omitted. Therefore, the method of inspecting the flatness of the substrate 101 is not limited to including the steps of calculating the first average or the second average.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of inspecting flatness of a substrate, comprising:
   providing the substrate having a surface;
   selecting a plurality of first inspecting points from the surface along a plurality of side-by-side first straight lines by an optical dimension measuring device, wherein the optical dimension measuring device selects N first inspecting points (Xi, Yi) along each of the first straight lines in an X direction; measuring a plurality of heights Zi of the first inspecting points along each of the first straight lines in the X direction by the optical dimension measuring device; by using a formula:

$$D = \sum_{i=1}^{N-1} \sqrt{(X_{i+1} - X_i)^2 + (Y_{i+1} - Y_i)^2 + (Z_{i+1} - Z_i)^2},$$

calculating a first measurement length D corresponding to each of the first straight lines;
by using a formula: F=(D−S)/S, calculating a plurality of first flatness indexes F, wherein one of the first flatness indexes F corresponds to one of the first straight lines, wherein S is a horizontal distance between $1^{st}$ first inspecting point and N-th first inspecting point along one of the first straight lines;
calculating a first average of the first flatness indexes F corresponding to the first straight lines; and
scrapping the substrate having the first average larger than a first threshold, determining that the substrate is unqualified.

2. The method of claim 1, further comprising:
selecting a plurality of second inspecting points from the surface along a plurality of side-by-side second straight lines not parallel to the first straight lines by the optical dimension measuring device, wherein the optical dimension measuring device select M second inspecting points (Aj, Bj) from the surface along one of the second straight lines in a Y direction perpendicular to the X direction; measuring a plurality of heights Cj of the second inspecting points along each of the second straight lines in the Y direction by the optical dimension measuring device
by using a formula:

$$d = \sum_{j=1}^{M-1} \sqrt{(A_{j+1} - A_j)^2 + (B_{j+1} - B_j)^2 + (C_{j+1} - C_j)^2},$$

calculating a second measurement length d corresponding to each of the second straight lines;
by using a formula: f=(d−R)/R, calculating a second flatness index f corresponding to each of the second straight lines, wherein R is a horizontal distance between $1^{st}$ second inspecting point and M-th second inspecting point along one of the second straight lines;
calculating a second average of the second flatness indexes f corresponding to the second straight lines; and
scrapping the substrate having the second average larger than a second threshold, determining that the substrate is unqualified.

3. The method of claim 2, further comprising:
identifying the substrate as being qualified when the first average is less than or equal to the first threshold, and the second average is less than or equal to the second threshold.

4. The method of claim 2, wherein a length of each of the first straight lines is larger than a length of each of the second straight lines, and N>M.

5. The method of claim 4, wherein the first threshold is 2.

6. The method of claim 5, wherein the second threshold is 2.

7. The method of claim 2, wherein the first threshold is 2.

8. The method of claim 7, wherein the second threshold is 2.

9. The method of claim 1, wherein the first threshold is 2.

10. The method of claim 1, wherein a horizontal distance between adjacent two of the first inspecting points is less than or equal to 1 cm.

* * * * *